(12) United States Patent
Lin

(10) Patent No.: US 7,535,713 B2
(45) Date of Patent: May 19, 2009

(54) IC SOCKET

(75) Inventor: Chun-Fu Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/879,376

(22) Filed: Jul. 16, 2007

(65) Prior Publication Data

US 2008/0014780 A1    Jan. 17, 2008

(51) Int. Cl.
  *H05K 7/20* (2006.01)
(52) U.S. Cl. .................... 361/704; 439/71; 439/73; 324/755
(58) Field of Classification Search .............. 361/699, 361/704; 439/326, 331, 71, 73, 266, 912, 439/487, 66, 75, 245–248, 525; 324/755, 324/765
  See application file for complete search history.

(56) References Cited

U.S. PATENT DOCUMENTS

| | | | | |
|---|---|---|---|---|
| 4,554,505 A | * | 11/1985 | Zachry | 324/755 |
| 5,127,837 A | * | 7/1992 | Shah et al. | 439/71 |
| 5,647,756 A | * | 7/1997 | Twigg et al. | 439/331 |
| 5,807,104 A | * | 9/1998 | Ikeya et al. | 439/73 |
| 6,033,235 A | * | 3/2000 | Ikeya | 439/71 |
| 6,086,387 A | * | 7/2000 | Gallagher et al. | 439/71 |
| 6,155,859 A | * | 12/2000 | Choy | 439/331 |
| 6,193,525 B1 | | 2/2001 | Takayama | |
| 6,213,806 B1 | * | 4/2001 | Choy | 439/331 |
| 6,353,329 B1 | * | 3/2002 | Kiffe | 324/760 |
| 6,439,897 B1 | * | 8/2002 | Ikeya | 439/73 |
| 6,464,528 B2 | * | 10/2002 | Yasufuku et al. | 439/377 |
| 6,468,101 B2 | * | 10/2002 | Suzuki | 439/326 |
| 6,547,580 B1 | * | 4/2003 | Leavitt et al. | 439/266 |
| 6,741,089 B2 | * | 5/2004 | Conroy | 324/755 |
| 6,752,645 B2 | * | 6/2004 | Nakamura et al. | 439/330 |
| 6,826,054 B2 | * | 11/2004 | Liu | 361/719 |
| 6,859,367 B2 | * | 2/2005 | Davison | 361/704 |
| 6,890,202 B2 | * | 5/2005 | Yasufuku et al. | 439/331 |
| 6,890,203 B2 | * | 5/2005 | Matsunaga et al. | 439/331 |
| 6,913,479 B1 | * | 7/2005 | Su et al. | 439/326 |
| 6,981,882 B1 | * | 1/2006 | Palaniappa | 439/73 |
| 6,982,551 B2 | * | 1/2006 | Yates | 324/158.1 |
| 7,230,830 B2 | * | 6/2007 | Ujike et al. | 361/704 |
| 7,335,030 B2 | * | 2/2008 | Kunioka et al. | 439/73 |
| 7,338,295 B2 | * | 3/2008 | Wooden et al. | 439/73 |
| 7,342,795 B2 | * | 3/2008 | Lee et al. | 361/719 |
| 2004/0174681 A1 | * | 9/2004 | Franz et al. | 361/704 |
| 2007/0217159 A1 | * | 9/2007 | Long et al. | 361/704 |

* cited by examiner

*Primary Examiner*—Jayprakash N Gandhi
*Assistant Examiner*—Courtney Smith
(74) *Attorney, Agent, or Firm*—Wei Te Chung

(57) ABSTRACT

An IC socket includes a socket body with a plurality of contacts disposed therein, a lid pivotably coupled to the socket body, a pushing member connected to the lid, and a heat sink fixed to said pushing member and being movable in a height direction relative to the lid. Because of being fixed to the pushing member, the heat sink can move with the pushing member and keep pressing on an IC chip in the case, for example, the changing of the thickness or position of the IC chip.

11 Claims, 4 Drawing Sheets

IC SOCKET

BACKGROUND OF THE INVENTION

1. Field of the Invention

This invention relates to a socket, and more particularly, to a socket for receiving an electrical element such as an integrated circuit (IC).

2. Description of the Related Art

Usually, a socket is needed to receive an IC chip and make electrical connection between the IC chip and a circuit board on which the socket mounted.

Generally, a heat sink assembled on the socket is needed to absorb and dissipate heat generated by the IC chip. U.S. Pat. No. 6,213,806 discloses an IC socket provided with a heat sink, in which the heat sink can be easily exchanged with another one when the thickness of an IC package or a size of the a pressing surface of the heat sink is changed. However, the exchanging of the heat sink brings the increasing of the cost and an additional manual process, so it's not profitable to control the cost and the efficiency in the testing process.

BRIEF SUMMARY OF THE INVENTION

Accordingly, it is an object of the present invention to provide an IC socket with a heat sink being movable in a height direction.

According to an embodiment of the present invention, an IC socket includes a socket body with a plurality of contacts disposed therein, a lid pivotably coupled to the socket body, a pushing member connected to the lid, and a heat sink fixed to the pushing member and being movable in a height direction relative to the lid.

It is another object of the present invention to provide an IC socket with a heat sink that can move with a pressing member while a lid keeps in it's original position.

According to an embodiment of the present invention, the IC socket includes a socket body with a plurality of contacts disposed therein, a lid pivotably coupled to the socket body, a pushing member connected to the lid and being movable relative to the lid, and a heat sink fixed to the pushing member without a relative movement therebetween. The pushing member defines a cutout and the heat sink has a touching portion extending through the cutout of pushing member.

Other objects, advantages and novel features of the present invention will become more apparent from the following detailed description of the present embodiment when taken in conjunction with the accompanying drawings.

DETAILED DESCRIPTION OF THE INVENTION

Figure 1:
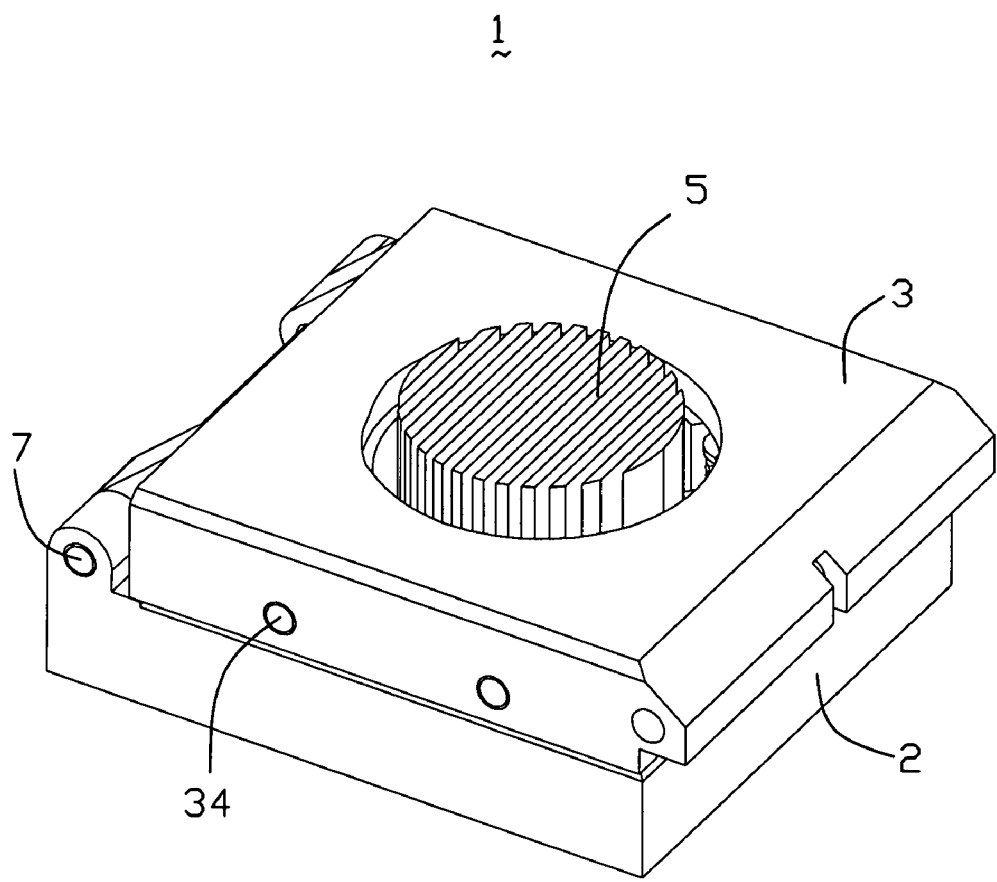
FIG. 1 is an assembled, perspective view of an IC socket according to an embodiment of the present invention.

FIG. 1 illustrates a perspective view of an IC socket in an close position according to an embodiment of the invention. The IC socket 1 mainly includes a socket body 2 mounted to a printed circuit board (not shown), a plurality of contacts 6 disposed in the socket body 2, a lid 3 pivotably coupled to the socket body 2, a pushing member 4 connected to the lid 3 and a heat sink 5 fixed to the pushing member 4.

Figure 2:
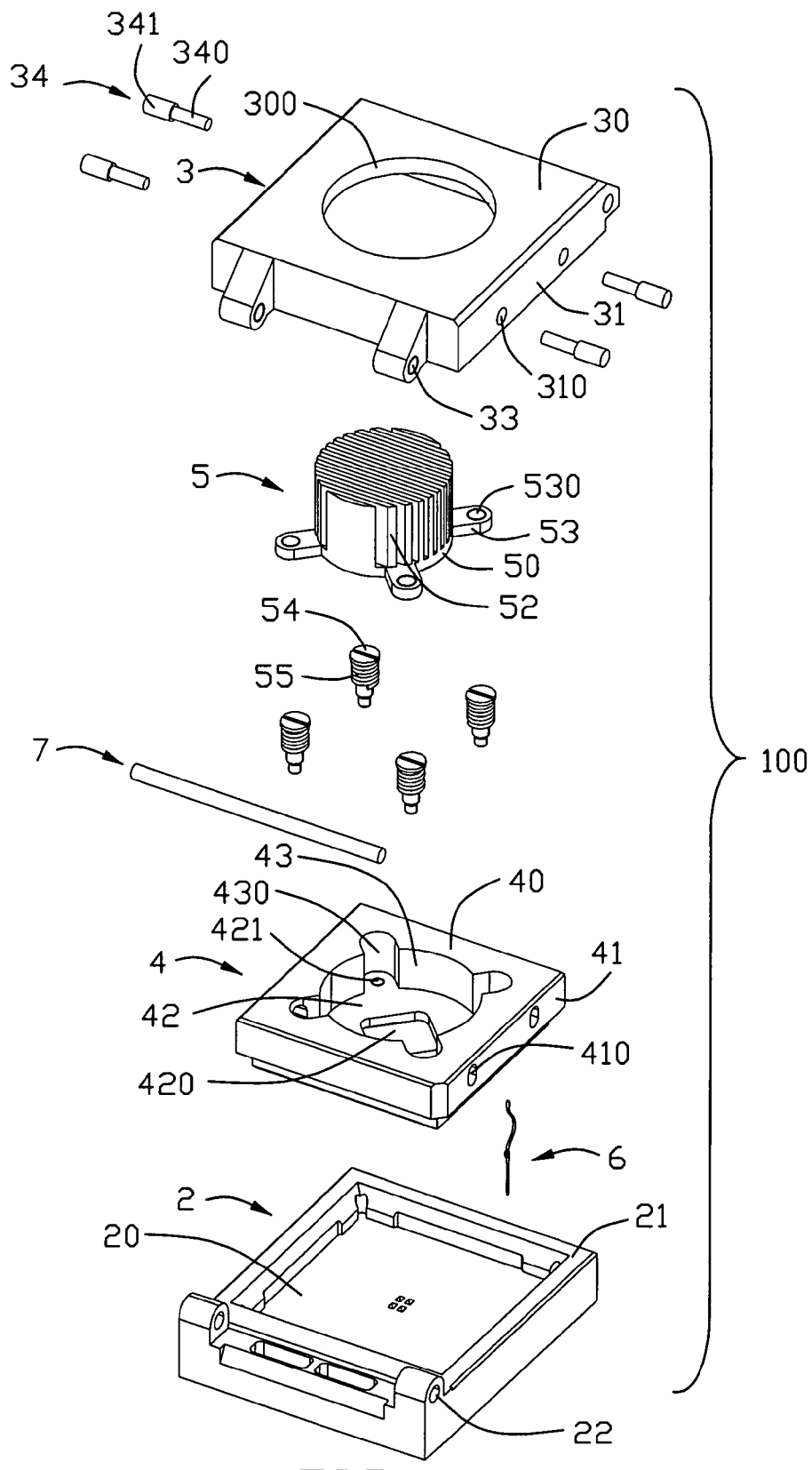
FIG. 2 is an exploded, perspective view of the IC socket according to the embodiment of the present invention.
Figure 3:
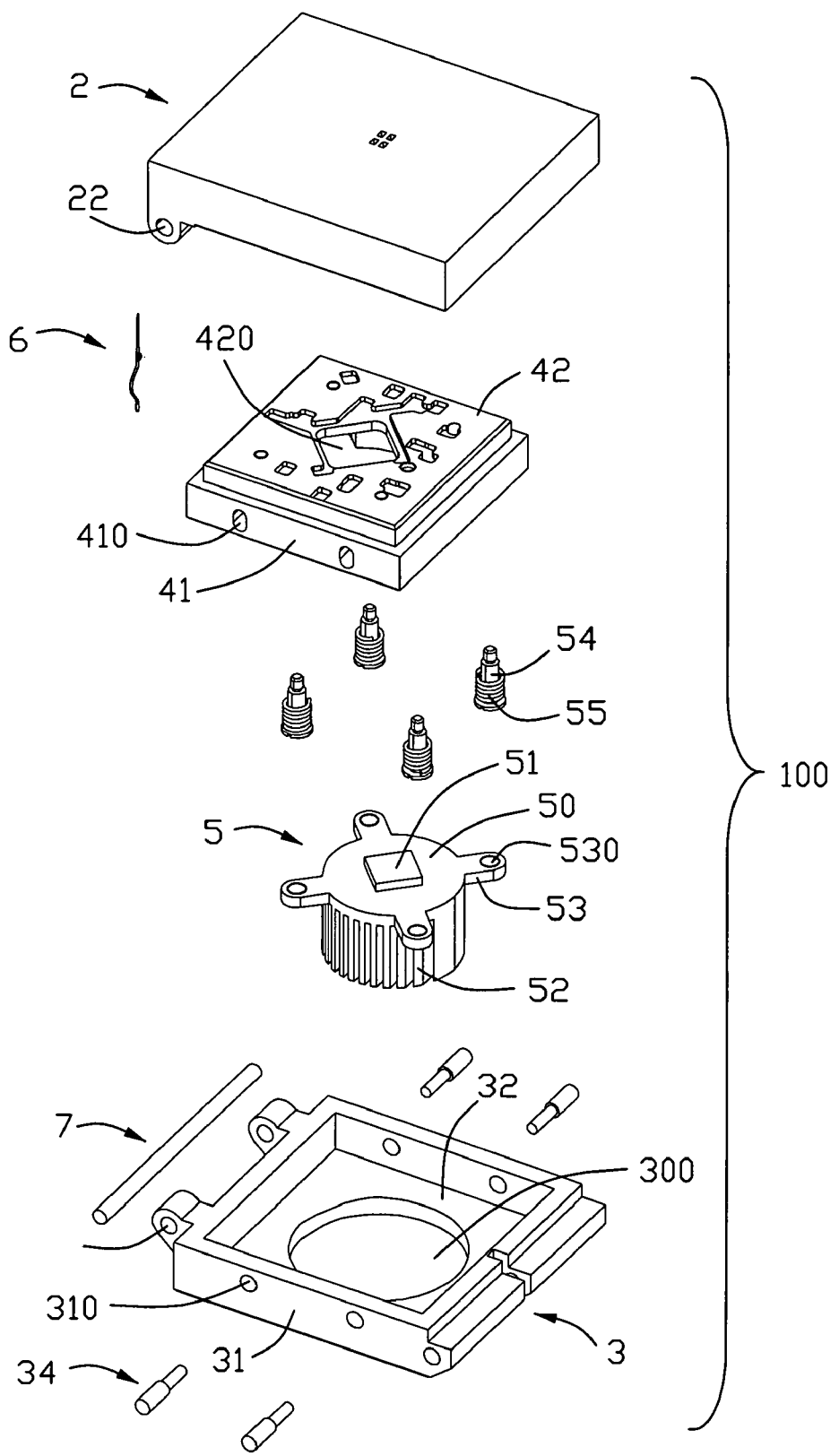
FIG. 3 is an exploded, perspective view of the IC socket according to the embodiment of the present invention, taken from another perspective.
Figure 4:
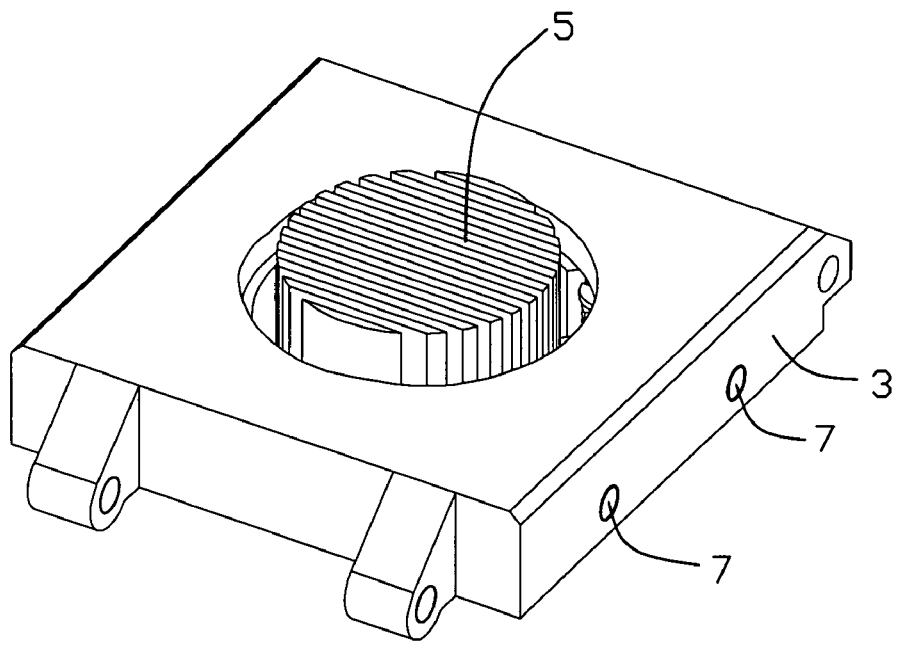
FIG. 4 is an assembled, perspective view of a pushing member, a heat sink and a lid according to the embodiment of the present invention.
Figure 5:
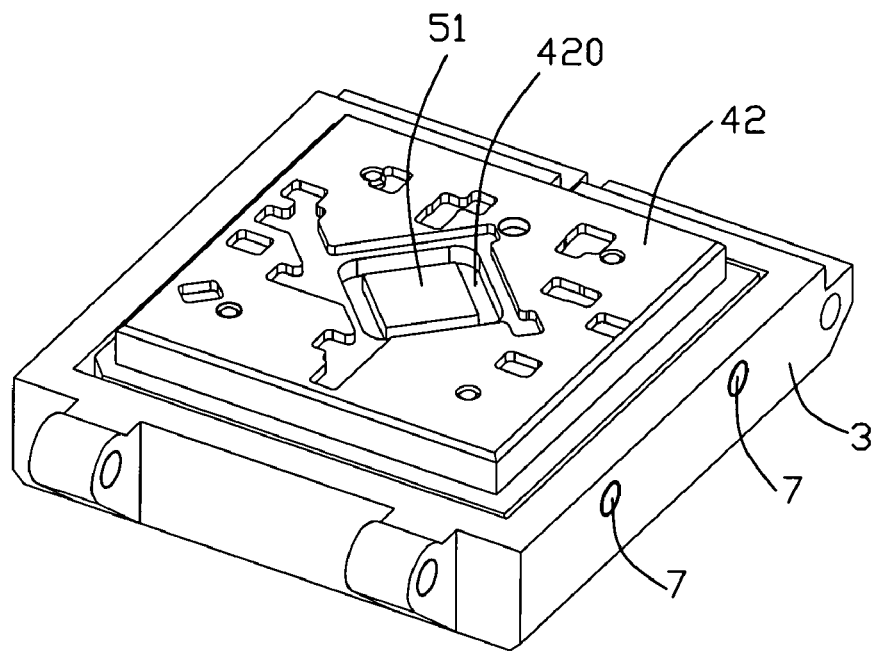
FIG. 5 is an assembled, perspective view of the pushing member, the heat sink and the lid of the IC socket, taken from a bottom side.

FIGS. 2-3 are exploded views illustrating the components of the IC socket 1 and FIGS. 4-5 are the assembled views of the lid 3, the pushing member 4, and the heat sink 5, taken from different perspectives. The socket body 2 is made of plastic material with an approximate rectangular structure. A loading space 20 recessed from an upper surface 21 of the socket body 2 is formed for accommodating an IC chip. The contacts 6 are disposed in the socket body 2 and located in the loading space 20. The various mounting methods of the contacts 6 are known well to a person having ordinary skill in the art, and we do not describe exactly here. Each of the contacts 6 has a contacting portion electrically connecting a corresponding electrode under the IC chip to make an electrical connection between the printed circuit board and the IC chip. A pair of through holes 22 are formed in one side of the socket body 2 for an insertion of a shaft 7.

The lid 3 is formed with a rectangular frame configuration, and is coupled and connected to the socket body 2 via the shaft 7 that enables the lid 3 to rotate relative to the socket body 2. The lid 3 includes a top surface 30 with a round cutout 300 in the middle thereof, four side walls 31 that define a containing space 32 together with the top surface 31 for containing the pushing member 4. A pair of through holes 33 are formed in one side of the lid 3 and are arranged in one line with the through holes 22 in the socket body 2, for the insertion of the shaft 7 and achieving a rotatably connection between the socket body 2 and the lid 3. On one pair of the opposite side walls 31, each of the side walls 31 has two round holes 310 formed therein for an insertion of a pole 34 respectively.

The pushing member 4 and the heat sink 5 are assembled and joined together tightly without a relative movement between them, via four screws 54 and corresponding coil springs 55 engaging with the screws 54. The heat sink 5 includes a bottom face 50, a touching portion 51 under the bottom face 50, and a plurality of cooling fins 52 extending upwardly from the bottom face 50. Four positioning legs 53 extend outwardly in the horizontal direction from the bottom face 50, and each of the positioning legs 53 has a positioning hole 530 for engaging with corresponding screw 54.

The pushing member 4 is formed with a rectangular shape and has an upper surface 40, four periphery faces 41 and a bottom wall 42. A round recess 43 is formed by recessing from the upper surface 40, and a rectangular cutout 420 is formed from the bottom wall 42, for enabling the touching portion 51 under the heat sink 5 to extend through. Four small recesses 430 are formed from the periphery of recess 43, and a positioning hole 421 is formed in the bottom wall 42 under each of small recesses 430. The heat sink 5 is partly contained in the recess 43 with each positioning leg 53 received in corresponding small recess 430. The screw 54 passes through corresponding coil spring 55, positioning hole 530 in the heat sink 5, and positioning hole 421 in the bottom wall 42 one by one, so the heat sink 5 is joined to the pushing member 4 tightly and reliably. On one pair of the periphery faces 41, each of the periphery faces 41 respectively has two ellipse holes 410, which are corresponding to the round holes 310 in the side walls 31 of the lid 3. The pole 34 is inserted through the round hole 310 and corresponding ellipse hole 410 one by one, to fasten the lid 3 and pushing member 4 together. The pole 34 includes a first part 340 retained in the ellipse hole 410 and a second part 341 retained in the round hole 310. The second part 341 is thicker than the first part 340. The diameter of the first part 340 is smaller than the length of the ellipse hole 410 in the height direction and the second part 341 has a substantial same diameter with the round hole 310. Therefore, because of the special configuration of the pole 34 having two parts engaging with different holes in the lid and pushing member 4 respectively, a relative movement between the lid 3 and pushing member 4 is possible, so the pushing member can move in the vertical direction relative to the lid 3 and it also means that the heat sink 5 fixed to the pushing member 4 is movable relative to the lid 3 in a height direction.

When the IC socket 1 is turned to a close position, the pushing member 4 is substantially parallel to the socket body 2 and covers on a top surface of the IC chip positioned in the loading spaces 20. The touching portion 51 of the heat sink 5 presses on the IC chip. After frequently use of the IC socket, a type of fatigue deformation may occur to the contacts 6 and make the IC chip descend downwardly away from its predetermined position in the height direction. Other reasons, for example, a changing of the thickness of an IC chip or a design mistake of the dimension of the components of the IC socket may cause the same problem. In the case of the problem above, because of the possible relative movement between the pushing member 4 and the lid 3, the pushing member 4 with the heat sink 5 fixed therein is possible to move in a height or a vertical direction by the deadweight of the heat sink and keep a touch between the touching portion 51 of the heat sink 5 and the IC chip, while the lid 3 keeps in it's original position in the height direction. Other means, a stuffing may be provided and inserted between the lid 3 and the pushing member 4 to give a downward pressure force to the pushing member 4.

It is to be understood, however, that even though numerous, characteristics and advantages of the present invention have been set fourth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An IC socket comprising:
a socket body with a plurality of contacts disposed therein;
a lid pivotably coupled to said socket body;
a pushing member connected to the lid; and
a heat sink fixed to said pushing member and being movable in a height direction relative to said lid;
wherein a plurality of holes are respectively formed in a pair of side walls of the lid and on a pair of the periphery faces of the pushing member, and a plurality of poles are inserted to said holes respectively.

2. The IC socket according to claim 1, wherein each of said poles is formed with a first part retained in the hole in the periphery face of said pushing member, and a second part retained in the hole in the side walls of said lid, the second part being thicker than the first part.

3. The IC socket according to claim 2, wherein said hole in the periphery face of said pushing member is formed with an ellipse configuration.

4. The IC socket according to claim 1, wherein said heat sink has four legs with a positioning hole respectively, and is fixed to said pushing member via four screws, each of the saews engaging witn a coil spring.

5. The IC socket according to claim 1, wherein said pushing member has a round recess with four small recesses formed therefrom, said heat sink being partly contained in said round recess with four legs retained in said small recesses respectively.

6. The IC socket according to claim 5, wherein said pushing member has a bottom wall with a cutout and said heat sink comprises a touching portion extending through the cutout.

7. An IC socket, comprising:
a socket body with a plurality of contacts disposed therein;
a lid pivotably coupled to said socket body:
a pushing member connected to the lid; and
a heat sink fixed to said pushing member and being movable in a height direction relative to said lid:
wherein a plurality of through holes are formed in said socket body and said lid, and a shaft is inserted into said holes to achieve the rotatable connection between the lid and the socket body; wherein
said heat sink is in a floating manner in said height direction relative to the pushing member.

8. The IC socket according to claim 6, wherein each of said poles is formed with a first part retained in the hole in the periphery face of said pushing member, and a second part retained in the hole in the side walls of said lid, the second part being thicker than the first part.

9. The IC socket according to claim 8, wherein said hole in the periphery face of said pushing member is formed with an ellipse configuration.

10. The IC socket according to claim 6, wherein said heat sink has four legs with a positioning hole respectively, and is fixed to said pushing member via four screws, each of the screws engaging with a coil spring.

11. The IC socket according to claim 6, wherein said pushing member has a round recess with four small recesses formed therefrom said heat sink being partly contained in said round recess with four legs retained in the small recesses.

* * * * *